United States Patent [19]
Lee et al.

[11] Patent Number: 5,788,800
[45] Date of Patent: Aug. 4, 1998

[54] WET ETCHING STATION AND A WET ETCHING METHOD ADAPTED FOR UTILIZING THE SAME

[75] Inventors: Kwang-yul Lee, Kyungki-do; Shang-seok Woo, Seoul; Jung-ho Kang, Kyungki-do, all of Rep. of Korea

[73] Assignee: Samsung Electronics Co., Ltd., Suwon, Rep. of Korea

[21] Appl. No.: 773,062

[22] Filed: Dec. 24, 1996

[30] Foreign Application Priority Data

Dec. 27, 1995 [KR] Rep. of Korea ............... 95-59508

[51] Int. Cl.$^6$ ............................................. H01L 21/302
[52] U.S. Cl. ................................... 156/345; 216/90
[58] Field of Search .......................... 156/345; 216/90

[56] References Cited

U.S. PATENT DOCUMENTS

| | | |
|---|---|---|
| 2,802,726 | 8/1957 | Langsfeld .................. 216/90 |
| 4,053,347 | 10/1977 | Glenn ...................... 156/637 |

FOREIGN PATENT DOCUMENTS 55-068633   5/1980   Japan .

*Primary Examiner*—R. Bruce Breneman
*Assistant Examiner*—George Goudreau
*Attorney, Agent, or Firm*—Jones & Volentine, L.L.P.

[57] ABSTRACT

A wet etching station and a wet etching method adapted for utilizing the same are provided. The wet etching station includes a bath apparatus containing a chemical etchant, with the bath apparatus having a plurality of cooling lines installed in the lower portion of the bath area, such that the cooling lines can make contact with the chemical etchant. Thus, a large-diameter wafer can uniformly etched.

3 Claims, 1 Drawing Sheet

WET ETCHING STATION AND A WET ETCHING METHOD ADAPTED FOR UTILIZING THE SAME

BACKGROUND OF THE INVENTION

The present invention relates to a wet etching station and a wet etching method adapted for utilizing the same. More particularly, it relates to a wet etching station and a wet etching method adapted to utilizing the same, which can uniformly etch a large-diameter wafer by taking advantage of differences in wet etching rates caused by an intentional nonuniform temperature distribution in the etching bath.

The high integration of semiconductor devices onto integrated circuits with increased capability requirements has led to smaller individual devices on larger chips. This, combined with the desire to reduce cost and increase productivity yields for semiconductor device fabrication, has promoted the use of large-diameter wafers. Such large-diameter wafers require greater process uniformity controls, since uniformity is a critical consideration when employing the larger wafers in semiconductor devices.

Therefore, it is essential to ensure an adequate process uniformity when handling a large-diameter wafer in a wet etching station. Such uniformity is indispensable to wet etching (or cleaning) in semiconductor device manufacturing. Wet etching generally proceeds with a group of wafers (a "batch") in a single run by contacting the batch with a bath containing a chemical etchant. In such a process, the etching rate is affected to a considerable extent by the temperature of the chemical etchant. Therefore, the chemical etchant is continuously circulated in the bath to keep its temperature uniform throughout the bath with the goal of ultimately obtaining a uniform etch-rate across an entire wafer.

A conventional wet-etching station will be described in detail with reference to FIG. 1.

In the prior art, the temperature of a chemical etchant 3 is to be kept uniform in the hope that the surface of a wafer 1 can be uniformly etched by being immersed in a bath 5 for wet-etching, wherein the bath contains a chemical etchant. To maintain such a uniform temperature, the chemical etchant 3 in the bath 5 needs to be constantly circulated by using a pump 7, which is regulated by a constant-temperature controller 9.

In the conventional wet etching station, when the wafer is immersed in the chemical etchant to perform an etching process, the lower portion of the wafer comes into contact with the chemical etchant earlier than the upper portion thereof. Also, when the etched wafer is taken out the upper portion of the wafer is exposed to the air earlier than is the lower portion thereof. Thus, during the wet etching, the lower portion of the wafer is in contact with the chemical etchant longer than any other portion thereof, resulting in that portion being etched longest. Likewise, the upper portion is etched for a correspondingly shorter time than any other portion of the wafer.

As is apparent from the above discussion, the wafer is not etched uniformly in the conventional etching batch process. This problem becomes especially serious when a large-diameter wafer is being produced to provide the high integration demanded for currently used semiconductor devices. As a result, the uniformity of the pattern formation is poor. This leads to variations in characteristics of the semiconductor device depending upon the chip location on the wafer.

Further, the reliability of an insulating layer is degraded because it does not have a uniformity of thickness across the entire wafer.

SUMMARY OF THE INVENTION overcome the above problems with etching-bath apparatus, it is an object of the present invention to provide a wet etching station which is adapted to provide uniform etching across a large-diameter wafer by taking advantage of differences in wet etching rates caused by an intentional nonuniform temperature distribution within the etching bath.

It is another object of the present invention to provide a wet etching method adapted to utilize the above wet etching station.

To achieve the above first object, there is provided a wet etching station comprising a bath containing a chemical etchant, wherein a plurality of cooling lines are installed in a lower portion of the bath, such that the cooling lines make contact with the chemical etchant.

To achieve the above second object, there is provided a wet etching method adapted to utilize a wet etching station having a plurality of cooling lines installed in a lower portion of a bath containing a chemical etchant, comprising the steps of: channelling a coolant, such as water and the like, having a lower temperature than the chemical etchant through the cooling lines, and thereby providing a higher relative temperature increasing the relative temperature of the chemical etchant in the upper portion of the bath as compared to a lower portion of the bath; and immersing a wafer to be etched in such a chemical etchant bath for a predetermined amount of time.

Accordingly, by utilizing the wet etching station and wet etching method of the present invention, a large-diameter wafer can be substantially uniformly etched. Hence, the conventional problem of degraded reliability of a large-diameter wafer caused by a non-uniform thickness of an insulating layer across the wafer can be avoided.

DETAILED DESCRIPTION OF THE INVENTION

The above objects and advantages of the present invention will become more apparent in view of the detail description below of a preferred embodiment thereof and by reference to the attached drawings.

Figure 1:
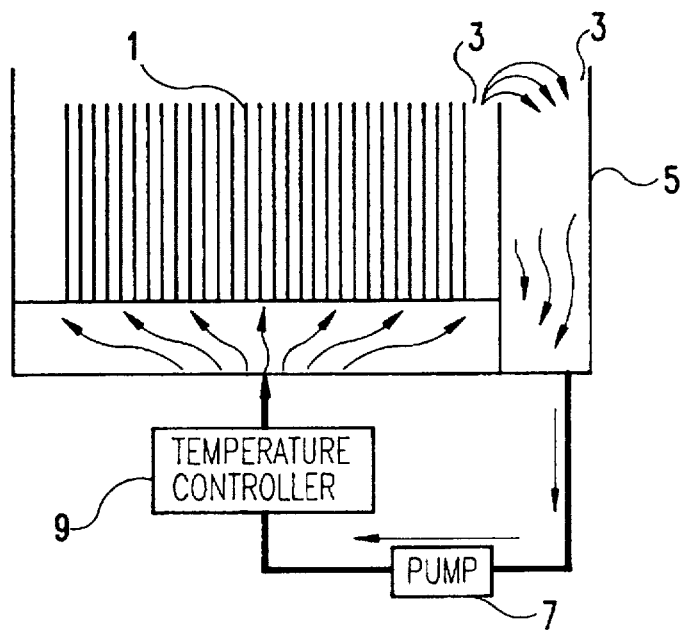
FIG. 1 is a side cross-sectional view of a conventional wet-etching station.
Figure 2:
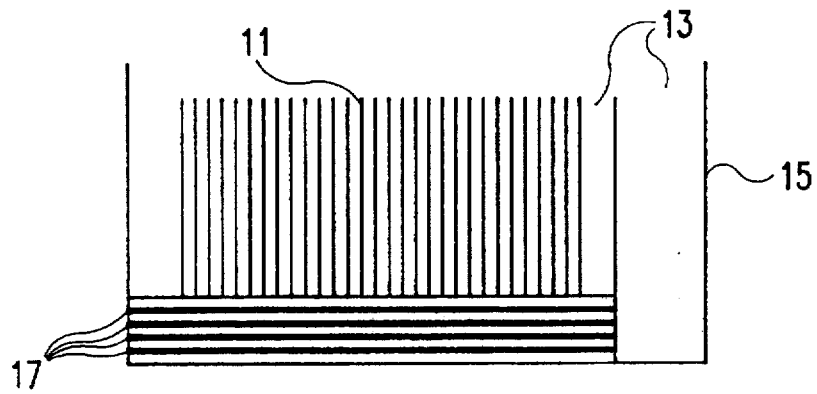
FIG. 2 is a side cross-sectional view of a preferred embodiment wet-etching station according to the present invention.
Figure 3:
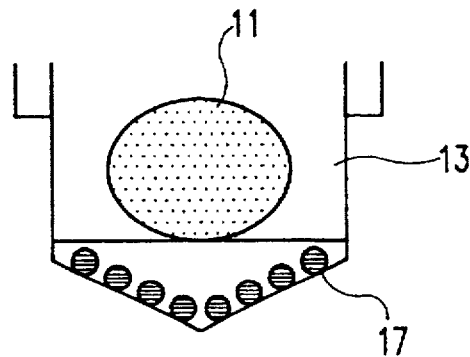
FIG. 3 is an end view of the preferred embodiment wet-etching station shown in FIG. 2.

In a preferred embodiment of the wet etching station of the present invention (as shown in FIGS. 2 and 3) to uniformly wet-etch a large-diameter wafer 11, a batch of which is immersed in a bath 15 containing a chemical etchant 13, a plurality of cooling lines 17 are installed in a lower portion of the bath 15, such that the cooling lines 17 are in contact with the chemical etchant 13.

During a wet etching process, when a coolant (such as cooling water and the like) having a temperature lower than the chemical etchant 13 flows through the cooling lines 17, without circulating the etchant of the bath (as is done in the prior art), the etchant's temperature where it contacts the middle portions of the wafer 11 is naturally greater than where it contacts the lower portions thereof. In addition, the temperature of the chemical etchant 13 that is contacting the upper portion of wafer 11 is even greater than that of the etchant contacting the wafer's middle portion.

Further, such a temperature differential can be created and controlled by adjusting a difference in temperatures between the coolant (such as cooling water) flowing through the tubes of the lower portion of the bath and the chemical etchant 13 in the upper portion of the bath. The flow rate of the coolant through the cooling tubes of the lower portion also can be varied to aid in the control of said temperature differential.

Therefore, if the wafer is wet-etched under such conditions of varying area bath temperatures, etching rates will vary in the lower, middle and upper portions of the wafer in a manner dependent upon the non-uniformity according to the spatial differences in temperature in the chemical etchant bath. That is, as described with respect to the conventional wet etching station, during wet etching, the lower portions of the wafer experience the longest contact time with the chemical etchant. Likewise the upper portion experiences the shortest contact time with the chemical etchant.

The present invention takes advantage of the differences in bath contact time for different portions of the wafer to provide a process whereby the lower portions of the wafer are more slowly etched for a longer period of time, while upper portions thereof are more rapidly etched for a shorter period of time. As a result, the wafer can be uniformly etched by controlling the temperature differential of the chemical etchant in the bath's strata, which translates into wafer surface location, and by adjusting the etching time. Moreover, such permits the etching bath temperature strata differentials to be adapted to correspond to the dimensions of the wafer being etched to tailor the etching process to the wafer size.

As described above, by utilizing the wet etching station and the wet etching method of the present invention, even a large-diameter wafer can be substantially uniformly wet-etched. Accordingly the conventional problem of degraded reliability of an insulating layer caused by variations in its thickness on the wafer can be minimized or entirely overcome. Thus, a semiconductor device can be produced with more consistent characteristics across the entire device.

The present invention has been described in detail with reference to the above embodiments, but the present invention is not restricted to such embodiments. It is clearly contemplated and understood that many variations are possible within the scope and spirit of the present invention by persons who are skilled in the art. Further, such variations are intended to be within the scope of the invention and within the scope of the appended claims.

What is claimed is:

1. A wet etching station comprising a bath apparatus containing a chemical etchant, wherein a plurality of cooling lines are installed in a lower portion of said bath apparatus and are positioned such that said cooling lines can make contact with said chemical etchant of said bath.

2. A wet etching station according to claim 1, which is adapted to channel water as a coolant through said cooling lines.

3. A wet etching station according to claim 1, which is adapted to avoid circulation of the chemical etchant within said bath apparatus during etching and said etching station is adapted to provide a strata of varying chemical etchant temperatures within said bath.

* * * * *